United States Patent [19]

Moulton

[11] Patent Number: 5,365,654
[45] Date of Patent: Nov. 22, 1994

[54] INTERLOCKING ATTACHMENT ASSEMBLY

[75] Inventor: Keith R. Moulton, Argyle, Tex.

[73] Assignee: Thermalloy, Inc., Nev.

[21] Appl. No.: 58,380

[22] Filed: May 10, 1993

[51] Int. Cl.[5] .................... H05K 3/34; B23P 19/04
[52] U.S. Cl. ................................. 29/761; 29/512; 29/283.5; 29/243.53; 29/837; 411/501; 411/181
[58] Field of Search .............. 29/512, 832, 837, 283.5, 29/238, 231, 726, 243.5, 243.53, 761; 411/500, 501, 177, 179, 180, 181

[56] References Cited

U.S. PATENT DOCUMENTS

| | | | |
|---|---|---|---|
| 2,096,598 | 10/1937 | Sheane | 411/501 |
| 2,410,398 | 10/1956 | Williams, Jr. et al. | 411/501 |
| 3,276,499 | 10/1966 | Reusser | 411/179 |
| 3,744,129 | 7/1973 | Dewey, Jr. | 29/837 |
| 3,910,331 | 10/1975 | Randall | 411/181 |
| 4,403,102 | 9/1983 | Jordan et al. | 29/840 X |
| 4,577,380 | 3/1986 | Warner | 29/726 X |

Primary Examiner—Timothy V. Eley
Assistant Examiner—Khan V. Nguyen
Attorney, Agent, or Firm—Jack A. Kanz

[57] ABSTRACT

Two or more bodies of sheet-like material are secured together with a single rivet-like fastening device which has an expanded head, a shank extending from the expanded head and a chamfer at the junction of the expanded head and the shank having a radius which is larger adjacent the head and which has bosses extending radially therefrom. An aperture is formed in the first body of material which substantially conforms to the radial dimensions of the shank and the shank is inserted into the aperture. A shaped aperture having radial dimensions which cooperate with the shank to define voids adjacent the shank is formed in the second body of material and the shank inserted into the shaped aperture. The shank is then axially compressed to force the first body over the chamfer and deform part of the first body into the voids in the second body, thus locking the first and second bodies together.

6 Claims, 3 Drawing Sheets

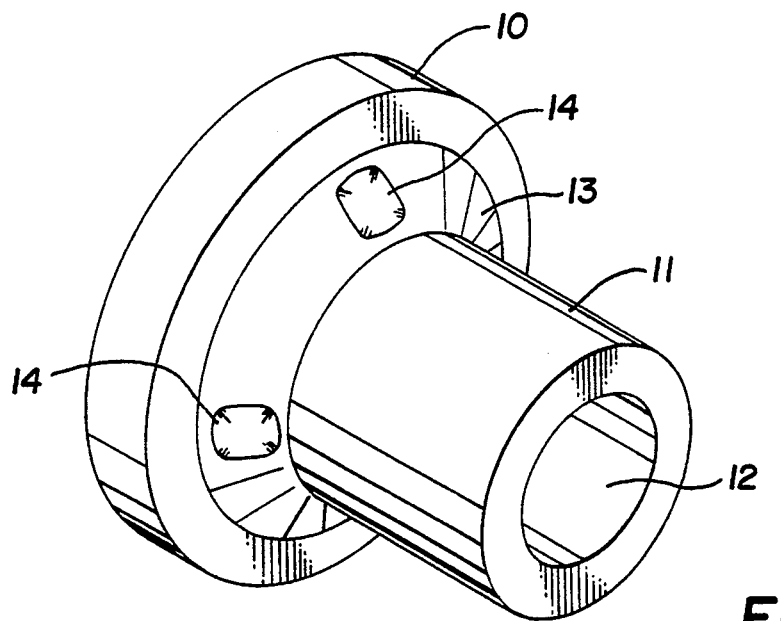
Fig. 1
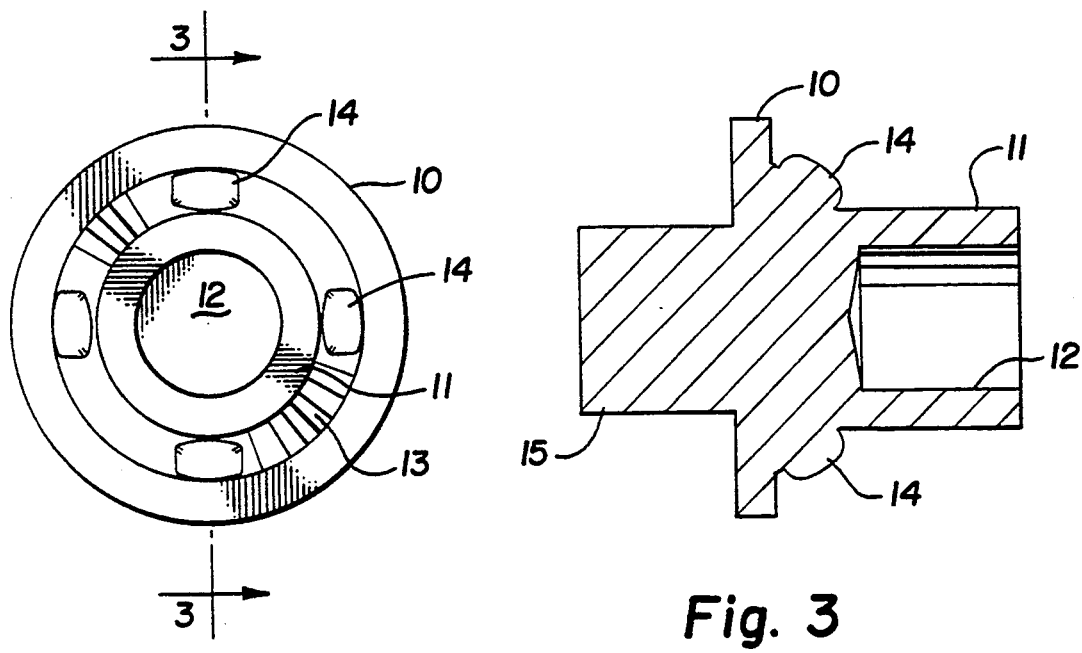
Fig. 2
Fig. 3

INTERLOCKING ATTACHMENT ASSEMBLY

This invention relates to attachment devices and methods for securing two or more bodies of sheet-like material together. More particularly, it relates to attaching two substantially flat bodies together with a single rivet-like device in an interlocking assembly which prevents rotation of one body with respect to the other and to specific devices and methods for forming such interlocking attachment structures.

Various mechanical devices, such as the common rivet, have long been used to conveniently and economically attach two or more bodies of sheet-like material together. In the typical arrangement, bodies of sheet material are superimposed one on the other and apertures in each aligned. A rivet inserted though both apertures is axially compressed to form an enlarged flattened head on both sides of the assembly, thereby securing the two bodies of sheet-like material together. Sheet metal screws, bolts and the like may be used to perform the same or similar function. When two or more such attachment devices are used to secure two bodies of sheet metal together, rotation of one body with respect to the other is precluded. However, in many sheet metal assemblies, a single attachment device is used to secure two or more bodies of sheet-like material together. In such cases, special precautions must be taken to prevent one body of sheet metal from rotating around the axis of the attachment device and thus moving with respect to the other body.

In the semiconductor industry, heat sinks are generally fabricated from sheet material by stamping and the like to form a device which has a flat base or face for attachment to the semiconductor device package and fins, etc., extending therefrom for radiating thermal energy. In many cases a resilient clip is used to releaseably secure the semiconductor device package to the flat base of the heat sink. It is, of course, desireable that such assemblies be manufactured as inexpensively and rapidly as possible. However, precision and reliability must not be compromised. Accordingly, great care must be taken to assure that the clip is permanently secured to the body of the heat sink in such a manner that the clip will not become misaligned through repeated use, vibration or other conditions to which it may be exposed. Accordingly, such clips are generally secured to the heat sink by spotwelding or the like.

Not only is it desireable that the heat sink assembly be itself economically manufactured and highly reliable, the heat sink assembly must be easily and readily attached to a circuit board or the like. Accordingly, the same mounting hardware such as bolts, screws, rivets or the like is sometimes used to mount the semiconductor device package on the heat sink and to secure the heat sink to the circuit board. However, use of such loose hardware is inconvenient and time consuming.

In accordance with the present invention two or more bodies of sheet-like material are joined in an assembly and interlocked to prevent rotation of one body with respect to the other using only a single mechanical attachment device. The attachment device is essentially a rivet with an expanded head and a shank extending from one face thereof. The rivet has a chamfer at the junction of the expanded head and the shank which has a larger radius adjacent the head. The chamfer also has at least one boss or shoulder extending therefrom. The two bodies are joined by forming an aperture in the first body which substantially conforms to the radius of the shank of the rivet. An aperture is formed in the second body having dimensions which do not conform to the dimensions of the shank but which, when assembled on the shank, define voids between the shank and the walls of the aperture in the second body. The attachment device is inserted through the aligned apertures and the assembly compressed along the axis of the shank so that the bosses on the chamfer are pressed into the material of the first body, thereby deforming material of the first sheet-like body and interlocking it with the attachment device. The chamfer further deforms material of the first body into the voids between the shank of the attachment device and the walls of the aperture in the second body, thereby interlocking the first body and second body to prevent relative rotation therebetween. Of course, the end of the shank of the attachment device adjacent the second body is flattened to form an opposite head which compresses the components and interlocks the entire assembly together. It will thus be observed that a single rivet-like device is used to attach two or more bodies of sheet-like material and interlock the bodies to prevent rotation with respect to each other and with respect to the attachment device.

The attachment device is extremely simply to fabricate and the assembly is extremely easy to complete. The invention thus provides an inexpensive method and apparatus for forming interlocking attachments between bodies of sheet materials using a single attachment device. Other features and advantages of the invention will become more readily understood from the following detailed description taken in connection with the appended claims and attached drawing in which:

FIG. 1 is a perspective view of a preferred embodiment of the attachment device of the invention;

FIG. 2 is an end view of the attachment device of FIG. 1;

FIG. 3 is a sectional view of the preferred embodiment of the attachment device of FIG. 1 including a solderable stud extending from the end face thereof;

Figure 5A:
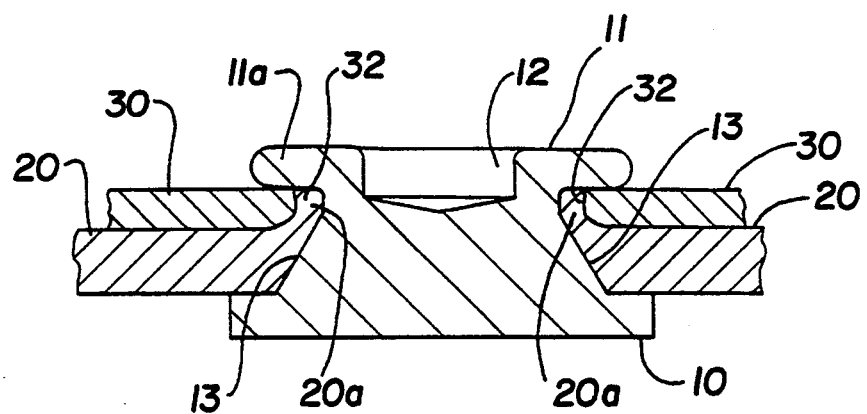
Figure 5B:
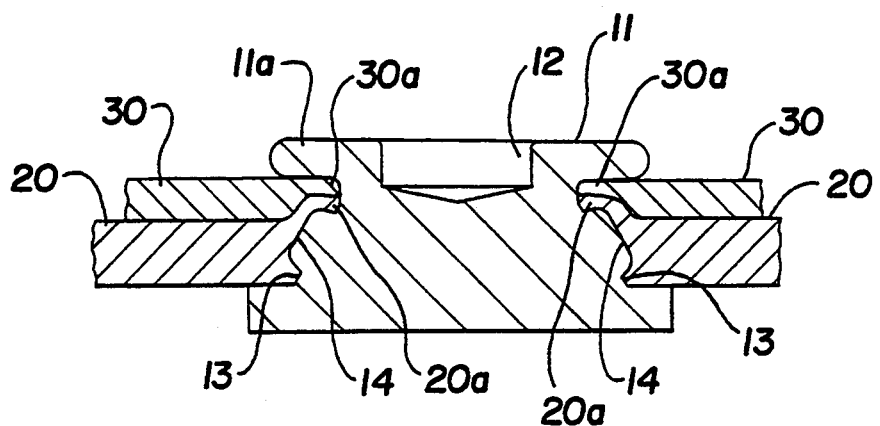

FIG. 5A is a sectional view of a completed assembly employing the device and method of the invention taken at a cross-section which traverses the voids between the shank of the attachment device and the walls of the aperture in the second sheet-like body; and FIG. 5B is a sectional view of a completed assembly employing the device and method of the invention taken at a cross-section which traverses the bosses on the chamfer (plane 3—3 of FIG. 2).

For clarity of illustration, the invention is described herein with particular reference to attachment of a spring clip to a heat sink body. It should be appreciated, however, that the invention is not so limited. Instead, the principles of the invention may be applied to any assembly wherein a sheet-like body of a deformable first material is attached to a sheet-like body of a second material. Furthermore, it will be readily recognized that the first material and second material may be the same or different material. As used herein, "deformable" means any material which may be permanently or temporarily deformed under pressure and includes malleable materials such as aluminum, aluminum alloys, steel, copper, copper alloys, etc.

As illustrated in FIGS. 1-3 the preferred embodiment of the attachment device of the invention comprises a rivet-like device which has a radially expanded head 10 with a cylindrical shank 11 extending from one face thereof. The shank 11 may have a central bore 12. It will be recognized that the structure of the attachment device generally resembles a standard sheet metal rivet. However, in the preferred embodiment the attachment device of the invention includes a chamfer 13 at the junction of the shank 11 and head 10. The chamfer 13 has a radius which is larger adjacent the head 10 and includes a plurality of bosses 14 which extend radially therefrom. Alternatively, bosses 14 may be a plurality of splines or a series of depressions in the chamfer 14, any of which define shoulders which will engage and deform a body of sheet material forced thereover and form an interlocking connection therewith which prevents rotation of the sheet material around the axis of the shank 12.

Figure 4:
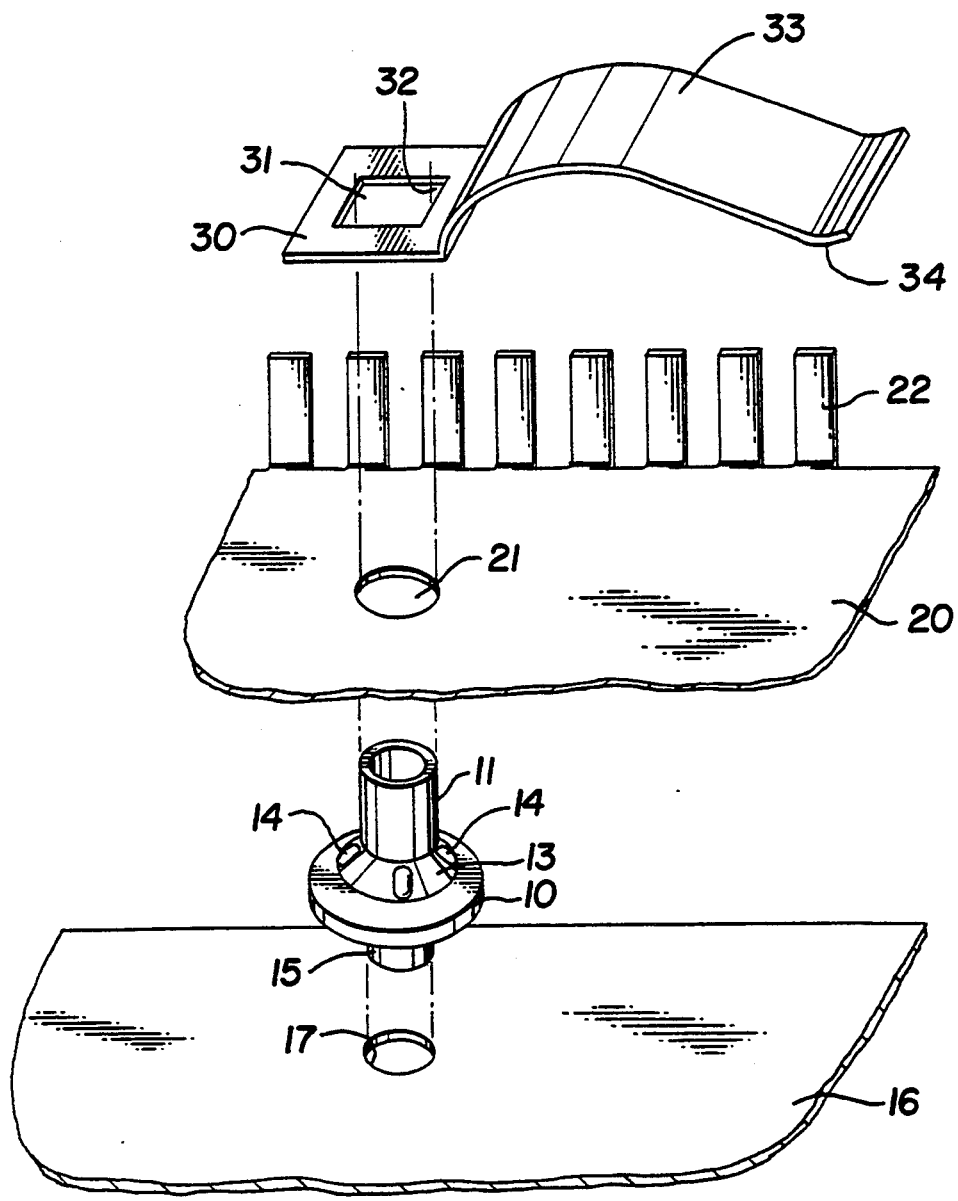
FIG. 4 is an exploded view of an assembly employing one embodiment of the assembly device of the invention and the method of the invention.

Assembly in accordance with the preferred embodiment of the invention is illustrated in FIG. 4. Aperture 21 is formed in a first sheet-like body 20 having dimensions substantially conforming to the radial dimensions of the shank 11 and shank 11 inserted through aperture 21. A shaped aperture 31 is formed in second sheet-like body 30 which does not conform to the radial dimensions of shank 11. In the embodiment illustrated, first body 20 is the base portion of a heat sink and second body 30 is formed into a clip having a spring portion 33 and a foot 34 for holding an electronic device package (not shown) adjacent the base portion 20 of the heat sink. Since only a single fastener is used to interconnect the assembly, the fastener must prevent movement of the clip 30 with respect to the base 20. To provide the desired anti-rotational interlocking of components, the aperture 31 in second body 30 does not conform to the dimensions of the shank. Instead, the aperture 31 has dimensions which, when positioned on the shank 11, define voids 32 between the shank 11 and the walls of the aperture 31. As illustrated in FIG. 4, the aperture 31 is preferably square having side lengths which conform to the diameter of shank 11. Since shank 11 is round and aperture 31 is square, a substantially triangular void 32 will be formed between the walls of the aperture 31 and the shank 11 at each of the four corners of the aperture 31 when shank 11 is inserted through aperture 31. Other dimensions and configurations may be used for aperture 31. For example, if the shank 11 is cylindrical, aperture 31 may be square (as shown), hexagonal, oval or may have other dimensions. For example, when aperture 31 is oval and its shortest diameter conforms to the diameter of shank 11, voids 32 are defined on opposite sides of the shank along the longest diameter of the oval-shaped aperture 31. Similarly, if the shank 11 is square, the aperture 31 may be circular or oval, etc. Various other combinations of shapes will be apparent to those skilled in the art.

FIGS. 5A and 5B illustrate the interlocking arrangement formed between the components in the final assembly. As shown in FIG. 5B, the shank 11 is inserted through apertures 21 and 31 and axially compressed to form an opposing flattened head 11a which presses bodies 20 and 30 together. Since the aperture 21 in first body 20 conforms to the dimensions of the shank pressing aperture 20 over the chamfer 13 expands and distorts aperture 21. As first body 20 is forced against the head 10, the bosses 14 are forced into the material of first body 20, deforming the material of first body 20 adjacent aperture 21 to conform to the configuration of chamfer 13 and bosses 14. Thus the bosses 14 are imbedded in the first body 20 and form an interlocking relationship which prevents rotation of first body 20 with respect to the fastening device.

As is illustrated in FIG. 5B, the material 20a of body 20 immediately surrounding the shank 11 and the material 30a of body 31 adjacent the shank 11 are compressed by the expanded head 11a formed from shank 11 when shank 11 is axially compressed.

The cross-sectional view of FIG. 5B is taken through the assembly in a plane which passes through diagonally opposite corners of the square aperture 31 in second body 30. For clarity of illustration, the rivet-like fastener is rotated to position bosses 14 outside the plane of this cross-sectional view. It will be appreciated, however, that bosses 14 may, in actual practice, lie in this plane or any other axial plane.

In the illustration of FIG. 5A the material 20a of first body 20 surrounding the shank 11 is deformed upwardly by being forced over the chamfer 13. However, since aperture 31 in the second body defines voids 32 adjacent the shank 11, the material 20a of first body 20 is deformed into the voids 32 by squeezing the material 20a of first body 20 into the voids 32. An interlocking relationship is thus formed between first body 20 and second body 30 which prevents rotation of these sheet-like bodies with respect to each other and prevents rotation of either body about the axis of shank 11. It will be recognized, of course, that axial compression of shank 11 should be sufficient to deform shank 11 to form an expanded head 11a and to force first body 20 into engagement with the head 10. Such radial compression is performed with otherwise conventional riveting techniques. It will be further recognized that shank 11 may be threaded and axial compression of the sheet-like bodies over the chamfer, etc., caused by a jamb nut or the like. Thus shank 11 need not necessarily be compressed to form the assembly of the invention.

As discussed with reference to FIGS. 5A and 5B, the first body 20, second body 30 and the fastening device are interlocked to prevent any movement of one component with respect to another. Thus, where the invention is employed to affix a spring clip to a heat sink as illustrated in FIG. 4, rotation of the spring clip with respect to the heat sink is prevented. Furthermore, in the embodiment of FIG. 4 the fastener device includes a stud 15 extending from the opposite face of the head 10 and coaxial with shank 11. As disclosed in U.S. Pat. No. 4,403,102 to Jordan, et al, the stud 15 (or the entire fastener device) may be pre-tinned or otherwise treated so that the stud 15 may be directly soldered to a circuit board or the like. When provided with such a stud 15, the entire assembly of heat sink and clip may be readily attached to a circuit board or the like by simply soldering the stud 15 (which extends from the fastener device) directly to a circuit board or the like.

The stud 15 may, of course, be appropriately designed to provide a stand-off, if desired (as also disclosed in the Jordan, et al. patent), or otherwise configured to appropriately attach the assembly to a circuit board or the like, thus employing a single fastener device to maintain the components of the heat sink in assembled condition and to mount the heat sink and device package on a circuit board in a single soldering operation.

From the foregoing it will be apparent that the principles of the invention may be applied in various assemblies to join components of an assembly with a single fastener which prevents rotation of the components of the assembly with respect to each other and to the fastener. Although the invention has been described with reference to specific embodiments thereof, it will be understood that the embodiments shown and described in detail are to be taken as preferred embodiments thereof. Various changes and modifications may be resorted to without departing from the spirit and scope of the invention as defined by the appended claims.

What is claimed:

1. An interlocking assembly for securing a deformable sheet material to another member comprising:
   (a) a fastener device having:
      (i) a radially expanded head with first and second oppositely disposed major faces;
      (ii) a shank having radial dimensions in a plane substantially parallel with the plane of said first major face extending from said first major face;
      (iii) a chamfer at the junction of said expanded head and said shank having a radius which is larger adjacent said first major face than adjacent said shank; and
      (iv) at least one shoulder extending from said chamfer;
   (b) a first body of deformable sheet material having an aperture therein which substantially conforms to the radial dimensions of said shank; and
   (c) a second body of material having a non-circular shaped aperture with walls surrounding said shank and cooperating with said shank to define at least one void between said shank and the walls of said aperture; wherein
   a portion of said first body of deformable material adjacent the aperture therein is deformed to conform to the configuration of said chamfer and said shoulder to prevent rotation of said first body of material with respect to said fastener device; and
   said portion of said first body of deformable material is deformed into said void to prevent rotation on said first body of deformable material with respect to said second body of material.

2. An assembly as defined in claim 1 wherein said first body of deformable material is a heat sink and said second body of material is a spring clip for maintaining an electronic device package adjacent said heat sink.

3. An assembly as defined in claim 2 including a stud extending from the second major face of said radially expanded head.

4. An assembly as defined in claim 3 wherein said stud is pre-tinned.

5. An assembly as defined in claim 6 wherein said stud is secured to a circuit board.

6. An assembly as defined in claim 5 wherein said stud is positioned in a hole in said circuit board and secured to said circuit board with solder.

* * * * *

UNITED STATES PATENT AND TRADEMARK OFFICE
CERTIFICATE OF CORRECTION

PATENT NO. : 5,365,654

DATED : November 22, 1994

INVENTOR(S) : Keith R. Moulton

It is certified that error appears in the above-identified patent and that said Letters Patent is hereby corrected as shown below:

Column 3, line 62,  "shank" should read ---shank 11,----
Column 6, line 23,  "claim 6" should read ---claim 3---

Signed and Sealed this

Seventh Day of February, 1995

Attest:

BRUCE LEHMAN

Attesting Officer     Commissioner of Patents and Trademarks